US012567870B2

(12) United States Patent (10) Patent No.: US 12,567,870 B2
Quinlan-Galper (45) Date of Patent: Mar. 3, 2026

(54) LOSSY COMPRESSION OF TIME SERIES DATA

(71) Applicant: Google LLC, Mountain View, CA (US)

(72) Inventor: Jeffrey Max Quinlan-Galper, Issaquah, WA (US)

(73) Assignee: Google LLC, Mountain View, CA (US)

( * ) Notice: Subject to any disclaimer, the term of this patent is extended or adjusted under 35 U.S.C. 154(b) by 172 days.

(21) Appl. No.: 18/397,744

(22) Filed: Dec. 27, 2023

(65) Prior Publication Data

US 2024/0223209 A1 Jul. 4, 2024

Related U.S. Application Data

(60) Provisional application No. 63/436,049, filed on Dec. 29, 2022.

(51) Int. Cl.
 *H03M 7/00* (2006.01)
 *H03M 7/30* (2006.01)
(52) U.S. Cl.
 CPC ................................. *H03M 7/3059* (2013.01)
(58) Field of Classification Search
 CPC .... H03M 7/30; H03M 7/3059; H03M 7/3064; H03M 7/6005; H03M 7/70; G06F 16/2477; G06F 12/08; G06F 16/1744; G06F 9/544
 USPC .............................................. 341/51, 87, 107
 See application file for complete search history.

(56) References Cited

U.S. PATENT DOCUMENTS

| | | | | | |
|---|---|---|---|---|---|
| 6,064,771 | A | * | 5/2000 | Migdal | ................... G06T 9/001 |
| | | | | | 382/232 |
| 7,155,376 | B2 | * | 12/2006 | Yang | .................... G08G 1/0112 |
| | | | | | 701/532 |
| 8,885,151 | B1 | * | 11/2014 | Chatham | ................. G01S 17/42 |
| | | | | | 356/4.07 |
| 10,706,605 | B1 | * | 7/2020 | Russo | ..................... G06F 9/453 |

(Continued)

FOREIGN PATENT DOCUMENTS

| | | | | |
|---|---|---|---|---|
| EP | 3945410 A1 | 2/2022 | | |
| EP | 3945410 B1 | * 3/2024 | ............... | G06F 7/02 |
| WO | 0314963 A1 | 2/2003 | | |

OTHER PUBLICATIONS

Fink et al., "Compression of Time Series by Extracting Major Extrema", Journal of Experimental and Theoretical Artificial Intelligence, Jun. 1, 2011 (Jun. 1, 2011), pp. 255-270, DOI: 10.1080/0952813X.2010.505800.

(Continued)

*Primary Examiner* — Linh V Nguyen
(74) *Attorney, Agent, or Firm* — Shumaker & Sieffert, P.A.

(57) ABSTRACT

A method includes obtaining time series data that includes a series of data points listed in temporal order. The method includes determining that a size of the time series data fails to satisfy a threshold size. In response, the method includes determining a range of the series of data points and determining, using the range of the series of data points, a respective score for each respective data point in the series of data points. The method also includes removing, using the respective scores for each data point in the series of data points, a plurality of data points from the series of data points. After removing the plurality of data points from the series of data points, the method includes determining an updated size of the series of data points and determining that (Continued)

500

OBTAINING TIME SERIES DATA COMPRISING A SERIES OF DATA POINTS LISTED IN TEMPORAL ORDER 502

DETERMINING THAT A SIZE OF THE TIME SERIES DATA SATISFIES A THRESHOLD SIZE 504

In Response to the Size Satisfying the Threshold

DETERMINING A RANGE OF THE SERIES OF DATA POINTS 506

DETERMINING, USING THE RANGE OF THE SERIES OF DATA POINTS, A RESPECTIVE SCORE FOR EACH RESPECTIVE DATA POINT IN THE SERIES OF DATA POINTS 508

REMOVING, USING THE RESPECTIVE SCORES FOR EACH DATA POINT IN THE SERIES OF DATA POINTS, A PLURALITY OF DATA POINTS FROM THE SERIES OF DATA POINTS 510

AFTER REMOVING THE PLURALITY OF DATA POINTS FROM THE SERIES OF DATA POINTS, DETERMINING AN UPDATED SIZE OF THE SERIES OF DATA POINTS 512

DETERMINING THAT THE UPDATED SIZE OF THE SERIES OF DATA POINTS FAILS TO SATISFY THE THRESHOLD SIZE 514 the updated size of the series of data points satisfies the threshold size.

14 Claims, 8 Drawing Sheets

(56)                    References Cited

U.S. PATENT DOCUMENTS

| 11,838,364 B2 * | 12/2023 | Sukhov | H04W 4/029 |
| 2013/0169644 A1 * | 7/2013 | Bolton | H04Q 9/00 |
| | | | 345/440 |
| 2013/0212142 A1 * | 8/2013 | Martinez Heras | G06F 17/17 |
| | | | 708/290 |
| 2015/0186434 A1 * | 7/2015 | Eichinger | G06F 16/2477 |
| | | | 707/693 |

| 2016/0212589 A1 * | 7/2016 | Cawse | G07B 15/00 |
| 2018/0284736 A1 * | 10/2018 | Cella | G01M 13/04 |
| 2019/0102840 A1 * | 4/2019 | Perl | G06Q 40/08 |
| 2025/0190799 A1 * | 6/2025 | Li | G06Q 40/051 |

OTHER PUBLICATIONS

International Search Report and Written Opinion issued in related PCT Application No. PCT/US2023/086076, dated Apr. 22, 2024.
Google Cloud, "Job", BigQuery, retrieved from: https://docs.cloud.google.com/bigquery/docs/reference/rest/v2/Job#jobstatistics4 on Nov. 13, 2025, 91 pp.
International Preliminary Report on Patentability from International Application No. PCT/US2023/086076 dated Jul. 10, 2025, 9 pp.
Lockerman et al., "Time-Series Compression Algorithms, Explained", Mar. 14, 2024, 19 pp.

* cited by examiner

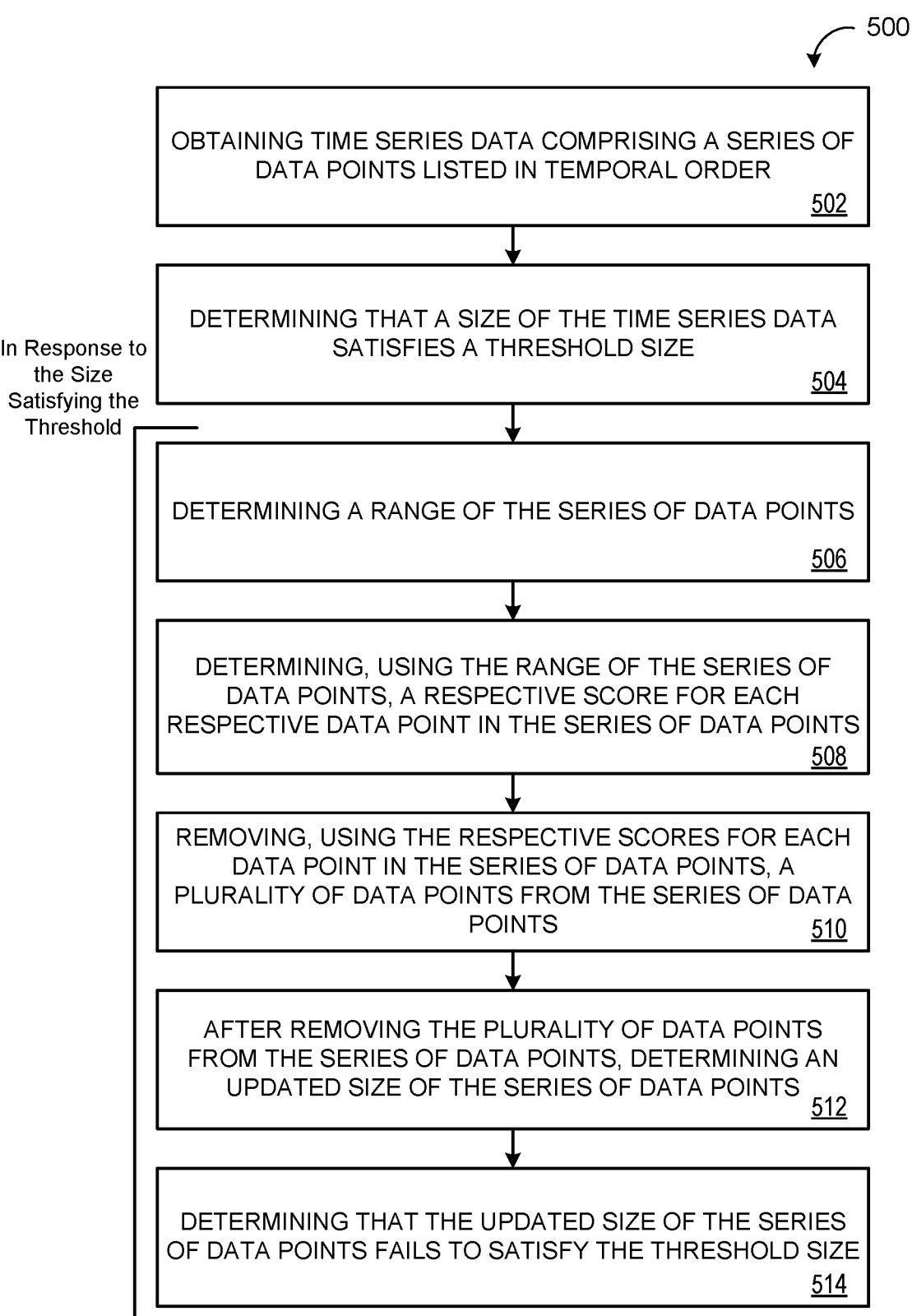

500

OBTAINING TIME SERIES DATA COMPRISING A SERIES OF DATA POINTS LISTED IN TEMPORAL ORDER

502

DETERMINING THAT A SIZE OF THE TIME SERIES DATA SATISFIES A THRESHOLD SIZE

504

In Response to the Size Satisfying the Threshold

DETERMINING A RANGE OF THE SERIES OF DATA POINTS

506

DETERMINING, USING THE RANGE OF THE SERIES OF DATA POINTS, A RESPECTIVE SCORE FOR EACH RESPECTIVE DATA POINT IN THE SERIES OF DATA POINTS

508

REMOVING, USING THE RESPECTIVE SCORES FOR EACH DATA POINT IN THE SERIES OF DATA POINTS, A PLURALITY OF DATA POINTS FROM THE SERIES OF DATA POINTS

510

AFTER REMOVING THE PLURALITY OF DATA POINTS FROM THE SERIES OF DATA POINTS, DETERMINING AN UPDATED SIZE OF THE SERIES OF DATA POINTS

512

DETERMINING THAT THE UPDATED SIZE OF THE SERIES OF DATA POINTS FAILS TO SATISFY THE THRESHOLD SIZE

LOSSY COMPRESSION OF TIME SERIES DATA

CROSS REFERENCE TO RELATED APPLICATIONS

This U.S. patent application claims priority under 35 U.S.C. § 119(e) to U.S. Provisional Application 63/436,049, filed on Dec. 29, 2022. The disclosure of this prior application is considered part of the disclosure of this application and is hereby incorporated by reference in its entirety.

TECHNICAL FIELD

This disclosure relates to lossy compression of time series data.

BACKGROUND

A time series is a series of data points ordered or listed in temporal order. For example, a logging feature may regularly or periodically log metrics of a system and save the metrics as a time series. There are many lossless compression techniques for time series data, such as delta, delta-delta, xor, run-length encoding, etc. These techniques compress the time series data by changing the representation of the data.

SUMMARY

One aspect of the disclosure provides a method for lossy compression of time series data. The computer-implemented method, when executed by data processing hardware, causes the data processing hardware to perform operations. The operations include obtaining time series data that include a series of data points listed in temporal order. The operations also include determining that a size of the time series data fails to satisfy a threshold size. In response to determining that the size of the time series data fails to satisfy the threshold size, the operations include determining a range of the series of data points. The operations also include determining, using the range of the series of data points, a respective score for each respective data point in the series of data points and removing, using the respective scores for each data point in the series of data points, a plurality of data points from the series of data points. After removing the plurality of data points from the series of data points, the operations include determining an updated size of the series of data points. The operations also include determining that the updated size of the series of data points satisfies the threshold size.

Implementations of the disclosure may include one or more of the following optional features. In some implementations, the range of the series of data points includes a highest value among values of the series of data points and a lowest value among the values of the series of data points. In some examples, the respective score for each respective data point in the series of data points includes a respective interpolation error representing an amount of error for interpolation when the respective data point is removed from the series of data points. In some of these examples, the respective interpolation error includes a difference between a value of the respective data point and a linear interpolated value representing the respective data point. Optionally, the respective interpolation error is scaled based on the range of the series of data points. The respective interpolation error includes a linear interpolation error. In some of these examples, each respective data point in the plurality of data points has a respective interpolation error that has a value of zero.

In some implementations, the respective score for each respective data point in the series of data points is based on a value of a neighbor of the respective data point. An average of values of the series of data points prior to removing the plurality of data points may be the same as an average of values of the series of data points after removing the plurality of data points. In some examples, the operations further include, after removing the plurality of data points from the series of data points, receiving, from a user, a request requesting real-time status information associated with the series of data points; and, in response to receiving the request, transmitting the series of data points to the user.

Another aspect of the disclosure provides a system for lossy compression of time series data. The system includes data processing hardware and memory hardware in communication with the data processing hardware. The memory hardware stores instructions that when executed on the data processing hardware cause the data processing hardware to perform operations. The operations include obtaining time series data that include a series of data points listed in temporal order. The operations also include determining that a size of the time series data fails to satisfy a threshold size. In response to determining that the size of the time series data fails to satisfy the threshold size, the operations include determining a range of the series of data points. The operations also include determining, using the range of the series of data points, a respective score for each respective data point in the series of data points and removing, using the respective scores for each data point in the series of data points, a plurality of data points from the series of data points. After removing the plurality of data points from the series of data points, the operations include determining an updated size of the series of data points. The operations also include determining that the updated size of the series of data points satisfies the threshold size.

This aspect may include one or more of the following optional features. In some implementations, the range of the series of data points includes a highest value among values of the series of data points and a lowest value among the values of the series of data points. In some examples, the respective score for each respective data point in the series of data points includes a respective interpolation error representing an amount of error for interpolation when the respective data point is removed from the series of data points. In some of these examples, the respective interpolation error includes a difference between a value of the respective data point and a linear interpolated value representing the respective data point. Optionally, the respective interpolation error is scaled based on the range of the series of data points. The respective interpolation error includes a linear interpolation error. In some of these examples, each respective data point in the plurality of data points has a respective interpolation error that has a value of zero.

In some implementations, the respective score for each respective data point in the series of data points is based on a value of a neighbor of the respective data point. An average of values of the series of data points prior to removing the plurality of data points may be the same as an average of values of the series of data points after removing the plurality of data points. In some examples, the operations further include, after removing the plurality of data points from the series of data points, receiving, from a user, a request requesting real-time status information associated with the series of data points; and, in response to receiving the request, transmitting the series of data points to the user.

The details of one or more implementations of the disclosure are set forth in the accompanying drawings and the description below. Other aspects, features, and advantages will be apparent from the description and drawings, and from the claims.

DESCRIPTION OF DRAWINGS

FIG. 5 is a flowchart of an example arrangement of operations for a method for compression of time series data.

Like reference symbols in the various drawings indicate like elements.

DETAILED DESCRIPTION

A time series is a series of data points ordered or listed in temporal order. For example, a logging feature may regularly or periodically log metrics of a system and save the metrics in a time series. There are many lossless compression techniques for time series data, such as delta, delta-delta, xor, run-length encoding, etc. These techniques compress the time series data by changing the representation of the data. However, when the time series data is publicly accessible, such representation change may be infeasible.

For example, when a data warehouse offers real-time updates or status information regarding stored time series data, the data warehouse must be capable of quickly (e.g., within seconds) providing the time series data (or representations of the time series data) to a user. Compressing the time series data using conventional means is impractical for such publicly exposed data, which, at best, will require significant refactoring and, at worst, will be incapable of decoding and providing the data at a sufficient speed.

Implementations herein are directed toward a time series compression system that provides lossy or lossless compression of time series data points by discarding a portion of data points of a time series based on changes in the data. This allows the system to maintain highly granular data where important changes are present while discarding data that is unchanging or changing slowly.

Figure 1:
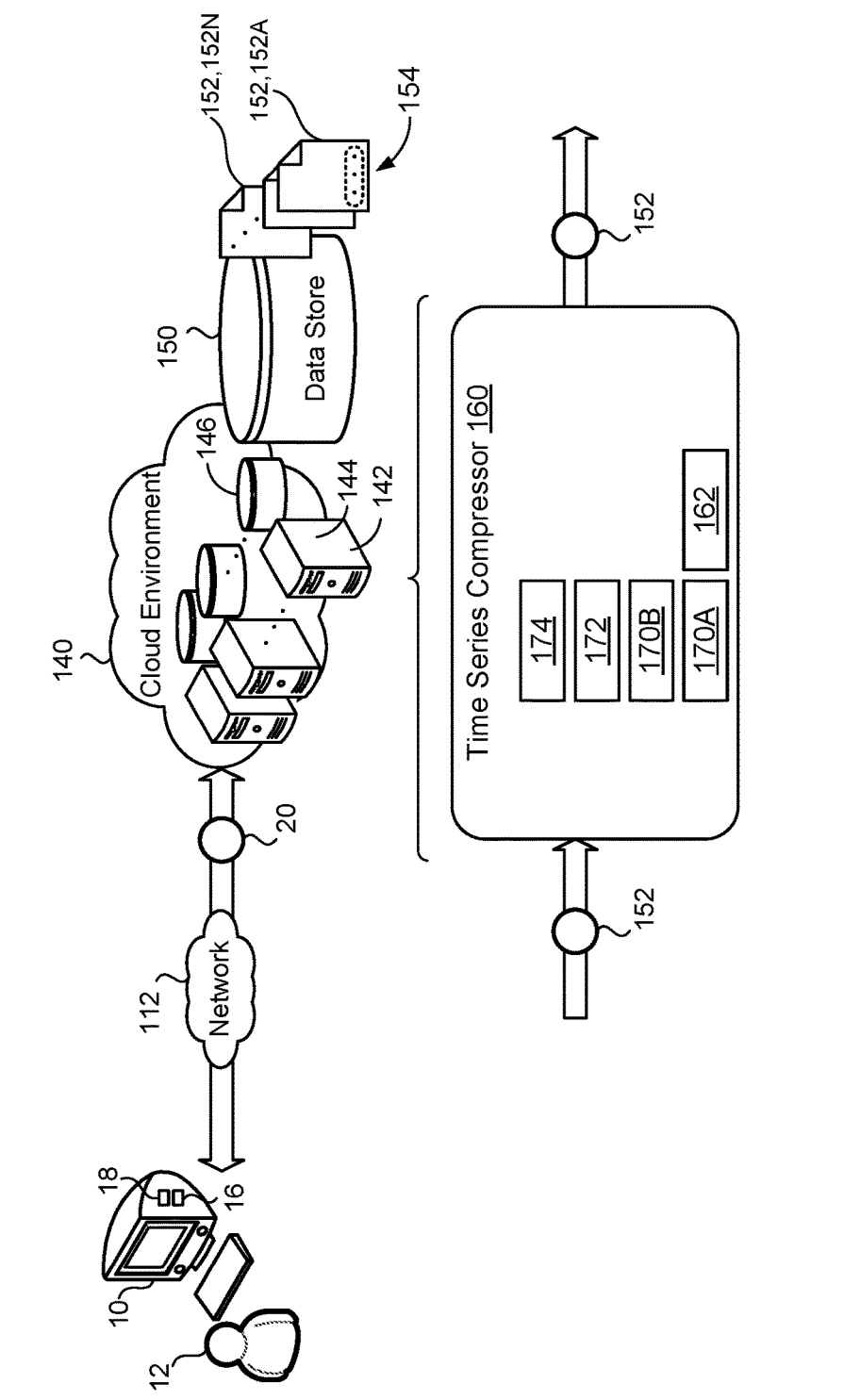
FIG. 1 is a schematic view of an example system for compression of time series data.

Referring to FIG. 1, in some implementations, an example time series compression system 100 includes a remote system 140 in communication with one or more user devices 10 via a network 112. The remote system 140 may be a single computer, multiple computers, or a distributed system (e.g., a cloud environment) having scalable/elastic resources 142 including computing resources 144 (e.g., data processing hardware) and/or storage resources 146 (e.g., memory hardware). A data store 150 (i.e., a remote storage device) may be overlain on the storage resources 146 to allow scalable use of the storage resources 146 by one or more of the clients (e.g., the user device 10) or the computing resources 144. The data store 150 is configured to store a set of data blocks 152, 152a-n (also referred to herein as time series data 152 or just data 152). The time series data 152 includes a series of data points 154 listed in time or temporal order. The data store 150 may store any amount of time series data 152.

The remote system 140 is configured to receive a time series data request 20 from a user device 10 associated with a respective user 12 via, for example, the network 112. The user device 10 may correspond to any computing device, such as a desktop workstation, a laptop workstation, or a mobile device (i.e., a smart phone). The user device 10 includes computing resources 18 (e.g., data processing hardware) and/or storage resources 16 (e.g., memory hardware). The time series data request 20 requests the remote system 140 provide the user 12 time series data 152 and/or data representing the time series data 152. In some implementations, the time series data request 20 requests the remote system 140 provide real-time (e.g., within a short period of time, such as less than five seconds or less than ten seconds) information regarding the time series data 152. For example, the time series data request 20 requests information on one or more jobs executing on the remote system based on the time series data 152 (e.g., resource consumption, pending tasks, etc.).

The remote system 140 executes a time series compressor 160. The time series compressor 160 receives or obtains the time series data 152 and determines that a first size 170A of a series of data points 154 of the time series data 152 satisfies a threshold size 162. The threshold size 162 is a maximum size for data (i.e., the time series data 152) in, for example, bytes and the size of the time series data 152 is the amount of space the times series data 152 requires to be stored (e.g., at the data store 150). For example, the threshold size 162 is five megabytes and when the size of respective time series data 152 (e.g., the respective series of data points 154) reaches or surpasses five megabytes, the threshold size 162 is satisfied.

The time series compressor 160, in response to determining that the first size 170A of the series of data points 154 satisfies the threshold size 162, determines a range 172 of the series of data points 154. The range 172 may define a maximum (i.e., highest or largest) value of the series of data points 154 and a minimum (i.e., lowest or smallest) value of the series of data points 154. For example, when the series of data points 154 is [1, 4, 8, 12, 23], the range is 1 to 23. Using the range 172 of the series of data points 154, the time series compressor 160 determines, for each respective data point 154 in the series of data points 154, a respective score 174. As discussed in more detail below, in some implementations, each score 174 is based on or represents an interpolation error for the respective data point 154 (i.e., an amount of error for interpolation if the respective data point 154 is removed from the series of data points 154).

The time series compressor 160, using the respective scores 174 for each data point 154 in the series of data point 154, removes at least one or a set of the data points 154 from the series of data points 154. After removing the set of data points 154 from the series of data points 154, the time series compressor 160 determines an updated size 170B or a second size 170B of the series of data points 154 (i.e., the size of the series of data points 154 with the set of data points 154 removed). When the updated size 170B of the series of data points 154 continues to satisfy the threshold size 162 (e.g., the size 170B is still too large), the time series compressor 160 may remove, based on the scores 174, additional data points 154. When the time series compressor 160 determines that the updated size 170B of the series of data points 154 fails to satisfy the threshold size 162 (e.g., the size of the reduced series of data points 154 is less than the threshold size 162), the time series compressor 160 may forego removing any additional data points 154 from the series of data points 154.

In some implementations, each respective score 174 includes a respective interpolation error. The interpolation error may be a linear interpolation error. For example, the interpolation error is based on or includes a difference between a value of the respective data point 154 and a linear interpolated value representing the respective data point 154. In some of these implementations, the interpolation error is scaled based on the range 172 of the series of data points 154. For example, the respective score 174 for each data point 154 in the series of data points 154 is equivalent to an absolute value of a scaled interpolation error for the respective data point 154.

Figure 2:
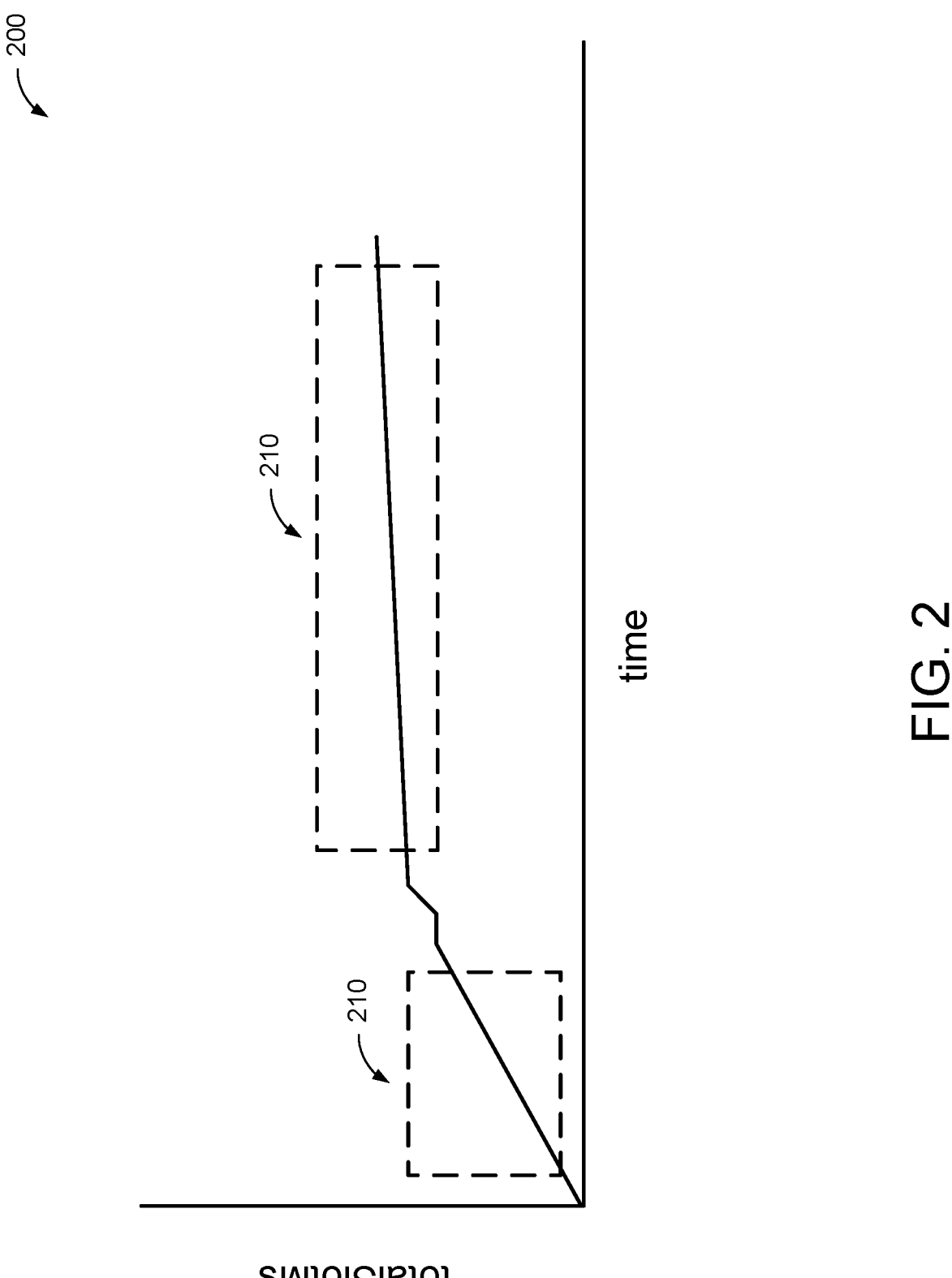
FIG. 2 is a plot of a metric over time that may be interpolated with minimal error.

Referring now to FIG. 2, in some scenarios, one or more portions of the series of data points 154 may be interpolated with perfect accuracy (i.e., lossless compression). FIG. 2 includes a plot 200 of time versus a metric (i.e., "total-SlotMs") that may be tracked by the remote system 140 at regular or irregular intervals (e.g., once a second). Here, the sections 210 may be interpolated with no or minimal error due to the linear nature of the sections 210.

Figure 3A:
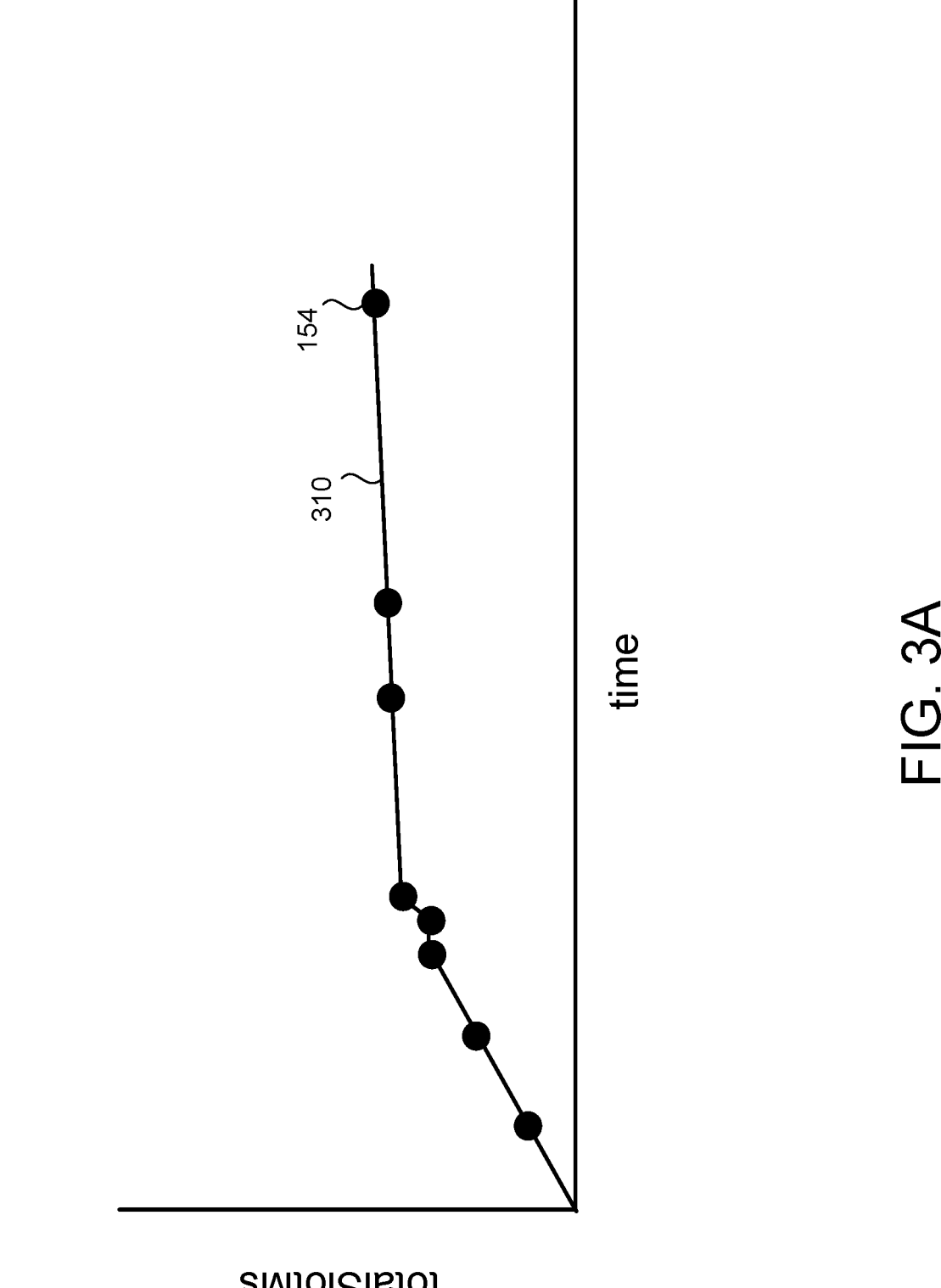
FIGS. 3A and 3B are schematic views of compression of the plot of FIG. 2.
Figure 3B:
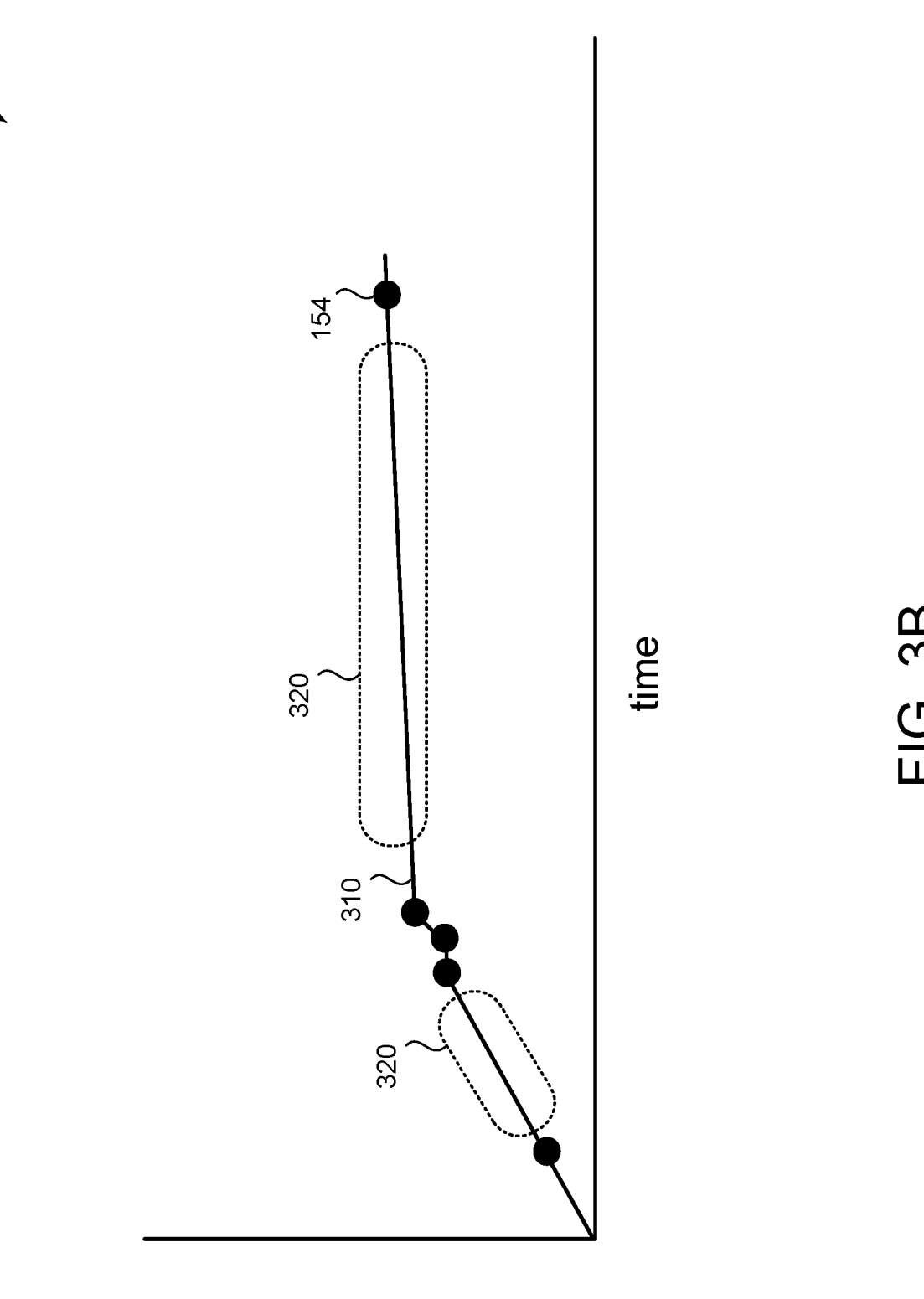

Referring now to FIG. 3A, a plot 300A mirrors the plot 200 of FIG. 2 with a series of data points 154 representing the time series data 152 that generates the plot 300A. Here, a line 310 is an interpolation of the data formed by the series of data points 154. As can be seen in FIG. 3B, the data points 154 that were in areas 320 may be safely removed without changing the interpolation of the line 310. That is, the line 310 is unchanged between plot 300A and plot 300B despite removing a portion of the data points 154 from plot 300B.

Figure 4A:
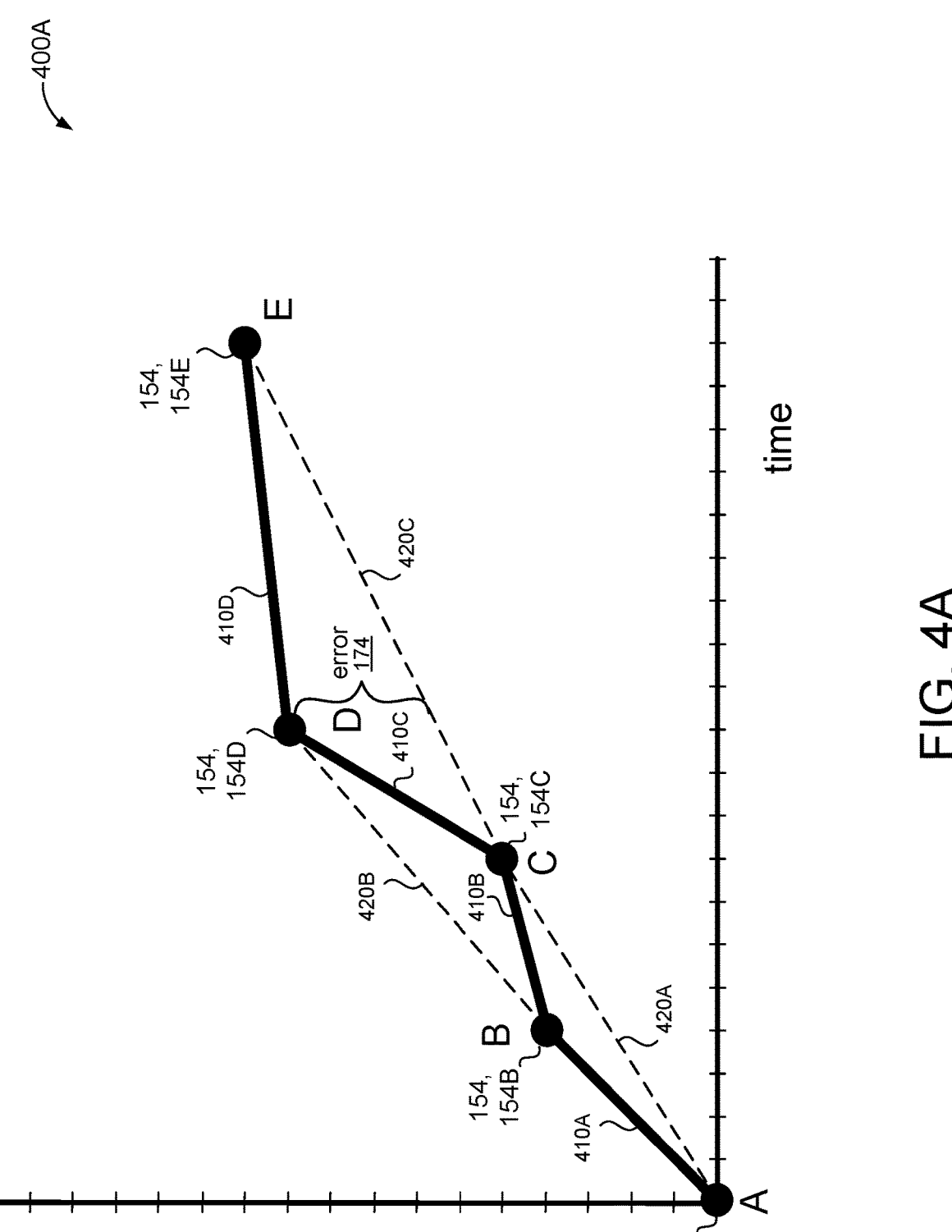
FIGS. 4A and 4B are schematic views of interpolation error of an exemplary plot.

FIG. 4A includes another exemplary plot 400A of time versus a metric tracked by the remote system 140. Here, lines 410A-D represent linear interpolations between each of five data points 154, 154A-E. In this example, the score 174 for each respective data point 154 is based on a vertical distance between the value (i.e., the position within the plot 400A) of the respective data point 154 and a value of predicted interpolation lines 420A-C is based on a linear interpolation between the data point 154 immediately before (temporally) the respective data point 154 and immediately after the respective data point 154. For example, the score 174 of data point 154D is represented by the offset between the data point 154D and the predicted interpolation line 420C. The predicted interpolation line 420C represents a linear interpolation between the data point 154C (i.e., the data point 154 immediately before the data point 154D) and the data point 154E (i.e., the data point 154 immediately after the data point 154D). In this example, the predicted interpolation line 420C represents the linear interpolation if the data point 154D were to be removed. Similarly, the predicted interpolation line 420A represents the linear interpolation if the data point 154B were to be removed and the predicted interpolation line 420B represents the linear interpolation if the data point 154C were to be removed. In this example, the score 174 for the data point 154B is 1.25, the score 174 for the data point 154C is 2.4, and the score 174 for the data point 154C is 3.5. In some examples, the first and last data points 154 of a series of data points 154 are never removed, and thus a score 174 need not be determined for those data points (i.e., the data points 154A, 154E in this example).

The time series compressor 160 may sort the scores 174 of the data points 154 (e.g., from smallest to largest) and remove one or more of the data points 154 based on the sorted scores 174. In some implementations, the time series compressor 160 removes the data point(s) with the lowest score 174 as these data points 154 show the least change from its neighbors.

Figure 4B:

Referring now to FIG. 4B, a plot 400B represents the plot 400A with the data point 154B removed. That is, because the data point B has the lowest score 174 (i.e., 1.25), the time series compressor 160 removes the data point 154B. After removing a data point 154, in some examples, the time series compressor 160 determines updated scores 174 for the immediate neighbors of the removed data point 154. In this example, the data point 154C now has a score 174 of 2 (updated from 2.4) based on the removal of the data point 154B. Because the data point 154A is still the first in the series of data points 154, no score 174 is determined for the data point 154A. The time series compressor 160 may continue removing data points 154 until sufficient size or space has been recovered (i.e., the size 170B of the series of data points 154 is less than the threshold size 162). In this example, the time series compressor 160 next removes the data point 154C because the data point 154C has the next lowest score 174 (i.e., 2 versus 3.5).

Thus, the time series compressor 160 removes the data points 154 from the series of data point 154 that least impact interpolation of the series of data points 154 until the series of data points 154 is less than the threshold size 162. In some implementations, the time series compressor 160 operates in a lossless manner by only removing data point 154 with a score of zero (i.e., removal of the data point 154 does not change interpolation of the data at all). In some implementations, in aggregate, the time series compressor 160 does not change the interpolation of the series of data points 154. For example, an average of values of the series of data points 154 prior to removing any data points 154 is the same as an average of values of the series of data points 154 after removal of one or more data points 154. While examples herein discuss interpolation (e.g., linear interpolation), the times series compressor 160 may use any appropriate means to determine the scores 174, such as last known values (i.e., using the previous points of value for one or more of the data points 154 as the source of error).

Referring back to FIG. 1, when the remote system 140 receives a request 20 from the user 12 (e.g., requesting real-time status information associated with a series of data points 154 the time series compressor 160 has compressed), the remote system 140 may respond rapidly (i.e., without refactoring or decoding the time series data 152) to the request 20 by transmitting the compressed series of data points 154 to the user 12. The time series compressor 160 may store snapshots of references using double linked lists.

In some implementations, the time series compressor 160 scales each score 174 based on the range of the series of data points 154. For example, each score 174 of a series of data points 154 $m$ is divided by $(\max(m)-\min(m))$. This results in converting the score 174 to a percentage (e.g., from 0 to 100 range). This may be especially advantageous when the time series data 152 includes multiple metrics (i.e., the times series data 152 includes multiple series of data points 154 that each track a different metric).

In some examples, when tracking multiple metrics simultaneously and when removing a data point 154, the time series compressor 160 removes the data point 154 for each metric. In these examples, the time series compressor 160 determines an error for each point in time across each metric to determine which data points 154 are the least valuable in aggregate across all metrics. For example, when the remote system 140 determines a value for three different metrics once every second, the time series compressor 160 determines an average for the score 174 of each of the three data points 154 at each time interval (i.e., at each second). The time series compressor 160 may use averages, standard deviation, minimums, maximums, or any other representation to determine an error that appropriately reflects the aggregate error of each metric. In some implementations, the time series compressor 160 determines the score 174 for each data point 154 using the following equation:

$$\text{error}_i = \frac{1}{len(M)} \sum_{m \in M} \frac{|\text{interpolate}(m_i) - \text{actual}(m_i)|}{\max(m) - \min(m)} \qquad (1)$$

Here, $\text{error}_i$ represents an aggregate error or score 174 for each metric in the time series data 152, M is the set of metrics, and m is a metric in the set of metrics. This allows the time series compressor 160 to determine multi-metric errors where each metric shares the same x-axis (i.e., a value is captured for each metric simultaneously at each sampling point), but have different values. In other words, the error of each metric is scaled by the range of that metric and then averaged (or any other suitable means of aggregating the error, such as standard deviation).

FIG. 5 is a flowchart of an exemplary arrangement of operations for a method 500 for lossy compression of time series data. The method 500, at operation 502, includes obtaining time series data 152 including a series of data points 154 listed in temporal order. At operation 504, the method 500 includes determining that a size 170A of the time series data 152 satisfies a threshold size 162. In response to determining that the size 170A of the time series data 152 satisfies the threshold size 162, the method 500, at operation 506, includes determining a range 172 of the series of data points 154 and, at operation 508, determining, using the range 172 of the series of data points 154, a respective score 174 for each respective data point 154 in the series of data points 154. At operation 510, the method 500 includes removing, using the respective scores 174 for each data point 154 in the series of data points 154, a plurality of data points 154 from the series of data points 154. The method 500, at operation 512, after removing the plurality of data points 154 from the series of data points 154, includes determining an updated size 170B of the series of data points 154. At operation 514, the method 500 includes determining that the updated size 170B of the series of data points 154 fails to satisfy the threshold size 162.

Figure 6:
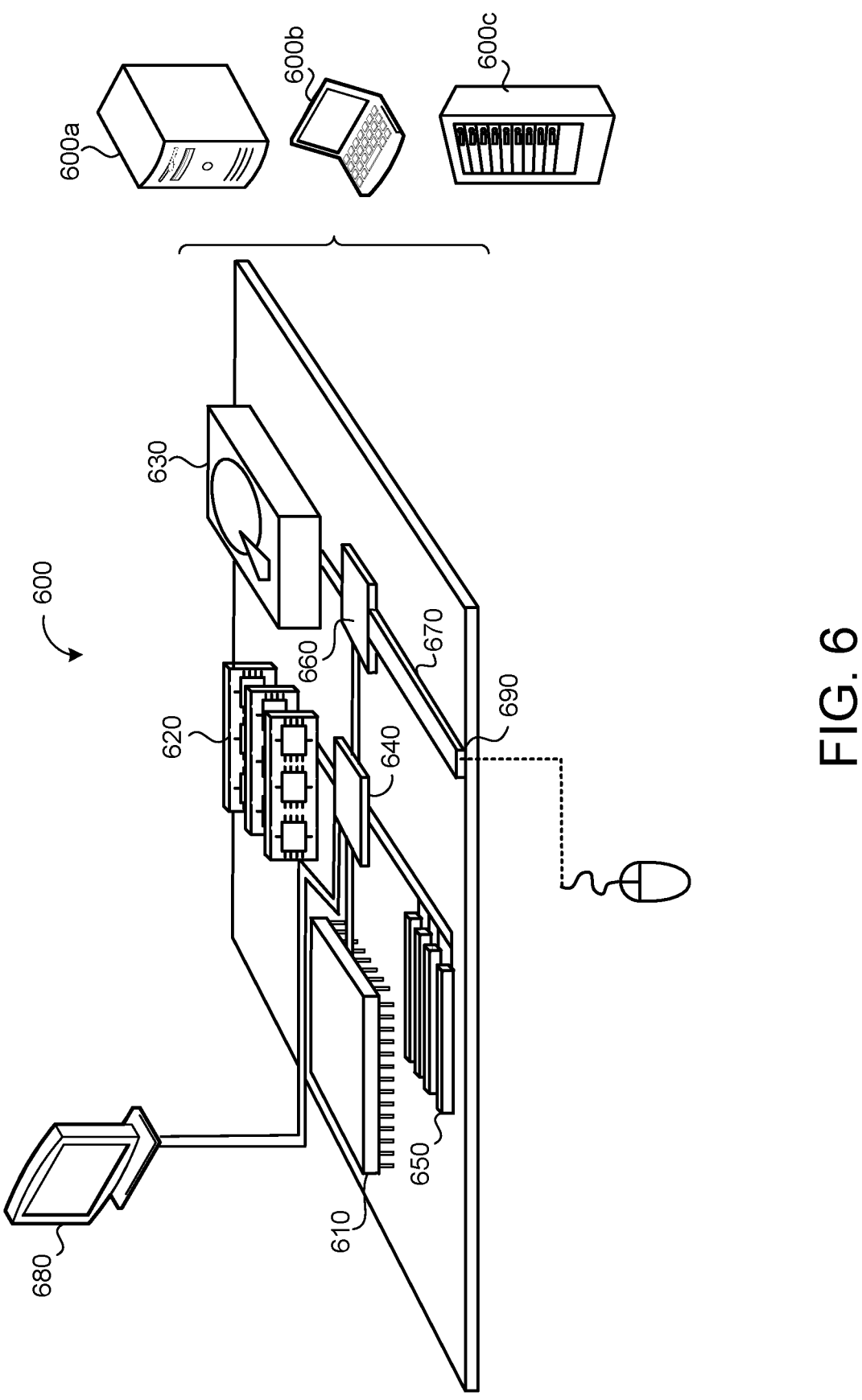
FIG. 6 is a schematic view of an example computing device that may be used to implement the systems and methods described herein.

FIG. 6 is a schematic view of an example computing device 600 that may be used to implement the systems and methods described in this document. The computing device 600 is intended to represent various forms of digital computers, such as laptops, desktops, workstations, personal digital assistants, servers, blade servers, mainframes, and other appropriate computers. The components shown here, their connections and relationships, and their functions, are meant to be exemplary only, and are not meant to limit implementations of the inventions described and/or claimed in this document.

The computing device 600 includes a processor 610, memory 620, a storage device 630, a high-speed interface/controller 640 connecting to the memory 620 and high-speed expansion ports 650, and a low speed interface/controller 660 connecting to a low speed bus 670 and a storage device 630. Each of the components 610, 620, 630, 640, 650, and 660, are interconnected using various busses, and may be mounted on a common motherboard or in other manners as appropriate. The processor 610 can process instructions for execution within the computing device 600, including instructions stored in the memory 620 or on the storage device 630 to display graphical information for a graphical user interface (GUI) on an external input/output device, such as display 680 coupled to high speed interface 640. In other implementations, multiple processors and/or multiple buses may be used, as appropriate, along with multiple memories and types of memory. Also, multiple computing devices 600 may be connected, with each device providing portions of the necessary operations (e.g., as a server bank, a group of blade servers, or a multi-processor system).

The memory 620 stores information non-transitorily within the computing device 600. The memory 620 may be a computer-readable medium, a volatile memory unit(s), or non-volatile memory unit(s). The non-transitory memory 620 may be physical devices used to store programs (e.g., sequences of instructions) or data (e.g., program state information) on a temporary or permanent basis for use by the computing device 600. Examples of non-volatile memory include, but are not limited to, flash memory and read-only memory (ROM)/programmable read-only memory (PROM)/erasable programmable read-only memory (EPROM)/electronically erasable programmable read-only memory (EEPROM) (e.g., typically used for firmware, such as boot programs). Examples of volatile memory include, but are not limited to, random access memory (RAM), dynamic random access memory (DRAM), static random access memory (SRAM), phase change memory (PCM) as well as disks or tapes.

The storage device 630 is capable of providing mass storage for the computing device 600. In some implementations, the storage device 630 is a computer-readable medium. In various different implementations, the storage device 630 may be a floppy disk device, a hard disk device, an optical disk device, or a tape device, a flash memory or other similar solid state memory device, or an array of devices, including devices in a storage area network or other configurations. In additional implementations, a computer program product is tangibly embodied in an information carrier. The computer program product contains instructions that, when executed, perform one or more methods, such as those described above. The information carrier is a computer- or machine-readable medium, such as the memory 620, the storage device 630, or memory on processor 610.

The high speed controller 640 manages bandwidth-intensive operations for the computing device 600, while the low speed controller 660 manages lower bandwidth-intensive operations. Such allocation of duties is exemplary only. In some implementations, the high-speed controller 640 is coupled to the memory 620, the display 680 (e.g., through a graphics processor or accelerator), and to the high-speed expansion ports 650, which may accept various expansion cards (not shown). In some implementations, the low-speed controller 660 is coupled to the storage device 630 and a low-speed expansion port 690. The low-speed expansion port 690, which may include various communication ports (e.g., USB, Bluetooth, Ethernet, wireless Ethernet), may be coupled to one or more input/output devices, such as a keyboard, a pointing device, a scanner, or a networking device such as a switch or router, e.g., through a network adapter.

The computing device 600 may be implemented in a number of different forms, as shown in the figure. For example, it may be implemented as a standard server 600a or multiple times in a group of such servers 600*a*, as a laptop computer 600*b*, or as part of a rack server system 600*c*.

Various implementations of the systems and techniques described herein can be realized in digital electronic and/or optical circuitry, integrated circuitry, specially designed ASICs (application specific integrated circuits), computer hardware, firmware, software, and/or combinations thereof. These various implementations can include implementation in one or more computer programs that are executable and/or interpretable on a programmable system including at least one programmable processor, which may be special or general purpose, coupled to receive data and instructions from, and to transmit data and instructions to, a storage system, at least one input device, and at least one output device.

A software application (i.e., a software resource) may refer to computer software that causes a computing device to perform a task. In some examples, a software application may be referred to as an "application," an "app," or a "program." Example applications include, but are not limited to, system diagnostic applications, system management applications, system maintenance applications, word processing applications, spreadsheet applications, messaging applications, media streaming applications, social networking applications, and gaming applications.

These computer programs (also known as programs, software, software applications or code) include machine instructions for a programmable processor, and can be implemented in a high-level procedural and/or object-oriented programming language, and/or in assembly/machine language. As used herein, the terms "machine-readable medium" and "computer-readable medium" refer to any computer program product, non-transitory computer readable medium, apparatus and/or device (e.g., magnetic discs, optical disks, memory, Programmable Logic Devices (PLDs)) used to provide machine instructions and/or data to a programmable processor, including a machine-readable medium that receives machine instructions as a machine-readable signal. The term "machine-readable signal" refers to any signal used to provide machine instructions and/or data to a programmable processor.

The processes and logic flows described in this specification can be performed by one or more programmable processors, also referred to as data processing hardware, executing one or more computer programs to perform functions by operating on input data and generating output. The processes and logic flows can also be performed by special purpose logic circuitry, e.g., an FPGA (field programmable gate array) or an ASIC (application specific integrated circuit). Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer are a processor for performing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Computer readable media suitable for storing computer program instructions and data include all forms of non-volatile memory, media and memory devices, including by way of example semiconductor memory devices, e.g., EPROM, EEPROM, and flash memory devices; magnetic disks, e.g., internal hard disks or removable disks; magneto optical disks; and CD ROM and DVD-ROM disks. The processor and the memory can be supplemented by, or incorporated in, special purpose logic circuitry.

To provide for interaction with a user, one or more aspects of the disclosure can be implemented on a computer having a display device, e.g., a CRT (cathode ray tube), LCD (liquid crystal display) monitor, or touch screen for displaying information to the user and optionally a keyboard and a pointing device, e.g., a mouse or a trackball, by which the user can provide input to the computer. Other kinds of devices can be used to provide interaction with a user as well; for example, feedback provided to the user can be any form of sensory feedback, e.g., visual feedback, auditory feedback, or tactile feedback; and input from the user can be received in any form, including acoustic, speech, or tactile input. In addition, a computer can interact with a user by sending documents to and receiving documents from a device that is used by the user; for example, by sending web pages to a web browser on a user's client device in response to requests received from the web browser.

A number of implementations have been described. Nevertheless, it will be understood that various modifications may be made without departing from the spirit and scope of the disclosure. Accordingly, other implementations are within the scope of the following claims.

What is claimed is:

1. A computer-implemented method comprising:
   obtaining, by data processing hardware, time series data comprising a series of data points listed in temporal order;
   determining, by the data processing hardware, whether a size of the time series data satisfies a threshold size; and
   responsive to determining that the size of the time series data satisfies the threshold size:
      determining a range of the series of data points, wherein the range includes a highest value among values of the series of data points and a lowest value among the values of the series of data points;
      determining, using the range of the series of data points, a respective score for each respective data point in the series of data points, wherein the respective score includes a respective interpolation error representing an amount of error for interpolation when the respective data point is removed from the series of data points, and wherein the respective interpolation error is scaled based on the range of the series of data points;
      removing, using the respective scores for each data point in the series of data points, a plurality of data points from the series of data points;
      after removing the plurality of data points from the series of data points, determining an updated size of the series of data points; and
      determining that the updated size of the series of data points fails to satisfy the threshold size.

2. The method of claim 1, wherein the respective interpolation error comprises a difference between a value of the respective data point and a linear interpolated value representing the respective data point.

3. The method of claim 1, wherein the respective interpolation error comprises a linear interpolation error.

4. The method of claim 1, wherein each respective data point in the plurality of data points has a respective interpolation error that has a value of zero.

5. The method of claim 1, wherein the respective score for each respective data point in the series of data points is based on a value of a neighbor of the respective data point.

6. The method of claim 1, wherein an average of values of the series of data points prior to removing the plurality of data points is the same as an average of values of the series of data points after removing the plurality of data points.

7. The method of claim 1, further comprising, after removing the plurality of data points from the series of data points:

receiving, from a user, a request requesting real-time status information associated with the series of data points; and in response to receiving the request, transmitting the series of data points to the user.

8. A system comprising:

data processing hardware; and memory hardware in communication with the data processing hardware, the memory hardware storing instructions that when executed on the data processing hardware cause the data processing hardware to:

obtain time series data comprising a series of data points listed in temporal order;

determine whether a size of the time series data satisfies a threshold size; and in response to determining that the size of the time series data satisfies the threshold size:

determine a range of the series of data points, wherein the range includes a highest value among values of the series of data points and a lowest value among the values of the series of data points;

determine, using the range of the series of data points, a respective score for each respective data point in the series of data points, wherein the respective score includes a respective interpolation error representing an amount of error for interpolation when the respective data point is removed from the series of data points, and wherein the respective interpolation error is scaled based on the range of the series of data points;

remove, using the respective scores for each data point in the series of data points, a plurality of data points from the series of data points;

after removing the plurality of data points from the series of data points, determine an updated size of the series of data points; and determine that the updated size of the series of data points fails to satisfy the threshold size.

9. The system of claim 8, wherein the respective interpolation error comprises a difference between a value of the respective data point and a linear interpolated value representing the respective data point.

10. The system of claim 8, wherein the respective interpolation error comprises a linear interpolation error.

11. The system of claim 8, wherein each respective data point in the plurality of data points has a respective interpolation error that has a value of zero.

12. The system of claim 8, wherein the respective score for each respective data point in the series of data points is based on a value of a neighbor of the respective data point.

13. The system of claim 8, wherein an average of values of the series of data points prior to removing the plurality of data points is the same as an average of values of the series of data points after removing the plurality of data points.

14. The system of claim 8, wherein the instructions further cause the data processing hardware to, after removing the plurality of data points from the series of data points:

receive, from a user, a request requesting real-time status information associated with the series of data points; and in response to receiving the request, transmit the series of data points to the user.

\* \* \* \* \*